United States Patent
Lin et al.

(10) Patent No.: US 11,220,424 B2
(45) Date of Patent: Jan. 11, 2022

(54) METHODS FOR INCREASING ASPECT RATIOS IN COMB STRUCTURES

(71) Applicant: Honeywell International Inc., Morris Plains, NJ (US)

(72) Inventors: Mu hong Lin, Golden Valley, MN (US); Eugene Freeman, Eden Prairie, MN (US)

(73) Assignee: Honeywell International Inc., Charlotte, NC (US)

( * ) Notice: Subject to any disclaimer, the term of this patent is extended or adjusted under 35 U.S.C. 154(b) by 270 days.

(21) Appl. No.: 16/253,421

(22) Filed: Jan. 22, 2019

(65) Prior Publication Data

US 2020/0048077 A1 Feb. 13, 2020

Related U.S. Application Data

(60) Provisional application No. 62/716,838, filed on Aug. 9, 2018.

(51) Int. Cl.
*B81C 1/00* (2006.01)
*B81B 7/00* (2006.01)
*G01C 19/574* (2012.01)

(52) U.S. Cl.
CPC ........ *B81C 1/00166* (2013.01); *B81B 7/0006* (2013.01); *G01C 19/574* (2013.01); *B81B 2201/0242* (2013.01); *B81B 2203/0136* (2013.01); *B81B 2203/04* (2013.01); *B81C 2201/0176* (2013.01); *B81C 2201/0194* (2013.01); *B81C 2203/031* (2013.01)

(58) Field of Classification Search
CPC ........... H01L 21/76898; H01L 27/1203; H01L 29/785; B81C 1/00166; B81C 2201/0176; B81C 2201/0194; B81C 2203/031; B81B 7/0006; B81B 2201/0242; B81B 2203/0136; B81B 2203/04
USPC ...................................... 73/504.14
See application file for complete search history.

(56) References Cited

U.S. PATENT DOCUMENTS

| 5,349,855 | A | 9/1994 | Bernstein et al. |
| 7,036,373 | B2 | 5/2006 | Johnson et al. |

(Continued)

FOREIGN PATENT DOCUMENTS

WO     2015048424 A1     4/2015

OTHER PUBLICATIONS

Akgul et al., "Oscillator Far-From-Carrier Phase Noise Reduction Via Nano-Scale Gap Tuning of Michromechanical Resonators", Transducers 2009, Jun. 2009, pp. 798-801, IEEE.

(Continued)

*Primary Examiner* — Octavia Hollington
(74) *Attorney, Agent, or Firm* — Fogg & Powers LLC

(57) ABSTRACT

A method comprises: patterning a substrate, including a conductive region, with photoresist exposed by lithography, where the substrate is mounted on a handle substrate; forming a comb structure with conductive fingers on the substrate by at least removing a portion of the conductive region of the substrate; removing the photoresist; forming, one atomic layer at a time, at least one atomic layer of at least one conductor over at least one sidewall of each conductive finger; attaching at least one insulator layer to the comb structure, and the substrate from which the comb structure is formed; and removing the handle substrate.

10 Claims, 3 Drawing Sheets

(56) References Cited

U.S. PATENT DOCUMENTS

| | | | |
|---|---|---|---|
| 7,426,067 | B1 | 9/2008 | Bright et al. |
| 7,625,790 | B2 * | 12/2009 | Yang .............. H01L 21/845 257/E21.001 |
| 7,703,324 | B2 | 4/2010 | Sutton et al. |
| 8,258,893 | B2 | 9/2012 | Quevy et al. |
| 9,041,116 | B2 * | 5/2015 | Doris .............. H01L 21/823842 257/369 |
| 9,142,633 | B2 * | 9/2015 | Besser .............. H01L 21/28518 |
| 9,611,135 | B1 | 4/2017 | Klein |
| 9,778,039 | B2 | 10/2017 | Najafi et al. |
| 9,938,133 | B2 | 4/2018 | Kautzsch et al. |
| 10,068,810 | B1 * | 9/2018 | Wu .............. H01L 21/0245 |
| 2004/0124483 | A1 | 7/2004 | Partridge et al. |
| 2006/0027020 | A1 | 2/2006 | Ocansey et al. |
| 2012/0077349 | A1 | 3/2012 | Li et al. |
| 2013/0224394 | A1 | 8/2013 | Hanbuecken et al. |
| 2014/0197502 | A1 * | 7/2014 | Dehe .............. B81C 1/00968 257/416 |
| 2016/0013183 | A1 * | 1/2016 | Basker .............. H01L 21/823431 257/401 |

OTHER PUBLICATIONS

European Patent Office, "Extended European Search Report from EP Application No. 1 9189696.8", from Foreign Counterpart to U.S. Appl. No. 16/253,421, dated Jan. 9, 2020, pp. 1-8, Published: EP.
Stoffels et al., "A novel gap narrowing process for creating high aspect ratio transduction gaps for MEM HF Resonators", Materials Research Society Symposium Proceeding, 2009, pp. 1-6, vol. 1139, 1139-GG01-05, Materials Research Society.
Clark, John R., et al. "Temperature Compensated Overtone Resonators"; Transducers 2013, Barcelona, Spain, Jun. 16-20, 2013; IEEE; pp. 794-797.
Gue, Lei, et al. "Patterning of Solid Films via Selective Atomic Layer Deposition Based on Silylation and UV/Ozonolysis"; ACS Applied Material & Interfaces, Aug. 2016; 2016 American Chemical Society; pp. 19836-19841.
Zhu, Young, et al. "A review of microelectromechanical systems for nanoscale mechanical characterization"; ResearchGate; Journal of Micromechanics and Microengineering; Sep. 2015; IOP Publishing Ltd; pp. 1-23; Published: UK.

\* cited by examiner

METHODS FOR INCREASING ASPECT RATIOS IN COMB STRUCTURES

CROSS-REFERENCED TO RELATED APPLICATIONS

This application claims benefit of provisional U.S. patent application Ser. No. 62/716,838 filed Aug. 9, 2018, which is incorporated herein by reference in its entirety.

BACKGROUND OF THE INVENTION

There is a need to increase aspect ratios the gaps between fingers of comb structures manufactured with semiconductor processing techniques. Comb structures include comb drive and comb sense micro-electro-mechanical systems (MEMS) devices. The comb structures each have interleaved fingers. The aspect ratio is the ratio of height of a gap between two adjacent fingers to the width of the gap.

As the aspect ratio is increased, the inter-finger capacitance is increased. The increased inter-finger capacitance enables larger displacement for a given voltage across two fingers. The increased capacitance enables more electric charge to be captured for a given voltage across two sets of fingers. Hence, the sensitivity of the comb structure is increased.

Typically, comb structures with large aspect ratios are formed with deep reactive ion etching (DRIE) using a Bosch process. The Bosch process for DRIE alternates between etching and passivation. During etching, dry chemical etching is combined with ion bombardment to remove material, e.g. silicon, between the fingers. However, this technique results in lateral undercutting, e.g. of the fingers, so passivation is added as a protective layer to, e.g. the fingers, to prevent such undercutting. Further, DRIE using the standard Bosch process suffers from a lag phenomenon where the etch rate is inversely proportional to the aspect ratio. This limits the aspect ratio, the planarity of adjacent, substantially parallel sidewalls of fingers, and thus the sensitivity of the comb structures made with the Bosch process. Therefore, there is a need to address this problem.

BRIEF SUMMARY OF THE INVENTION

A method comprises: patterning a substrate, including a conductive region, with photoresist exposed by lithography, where the substrate is mounted on a handle substrate; forming a comb structure with conductive fingers on the substrate by at least removing a portion of the conductive region of the substrate; removing the photoresist; forming, one atomic layer at a time, at least one atomic layer of at least one conductor over at least one sidewall of each conductive finger; attaching at least one insulator layer to the comb structure, and the substrate from which the comb structure is formed; and removing the handle substrate.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
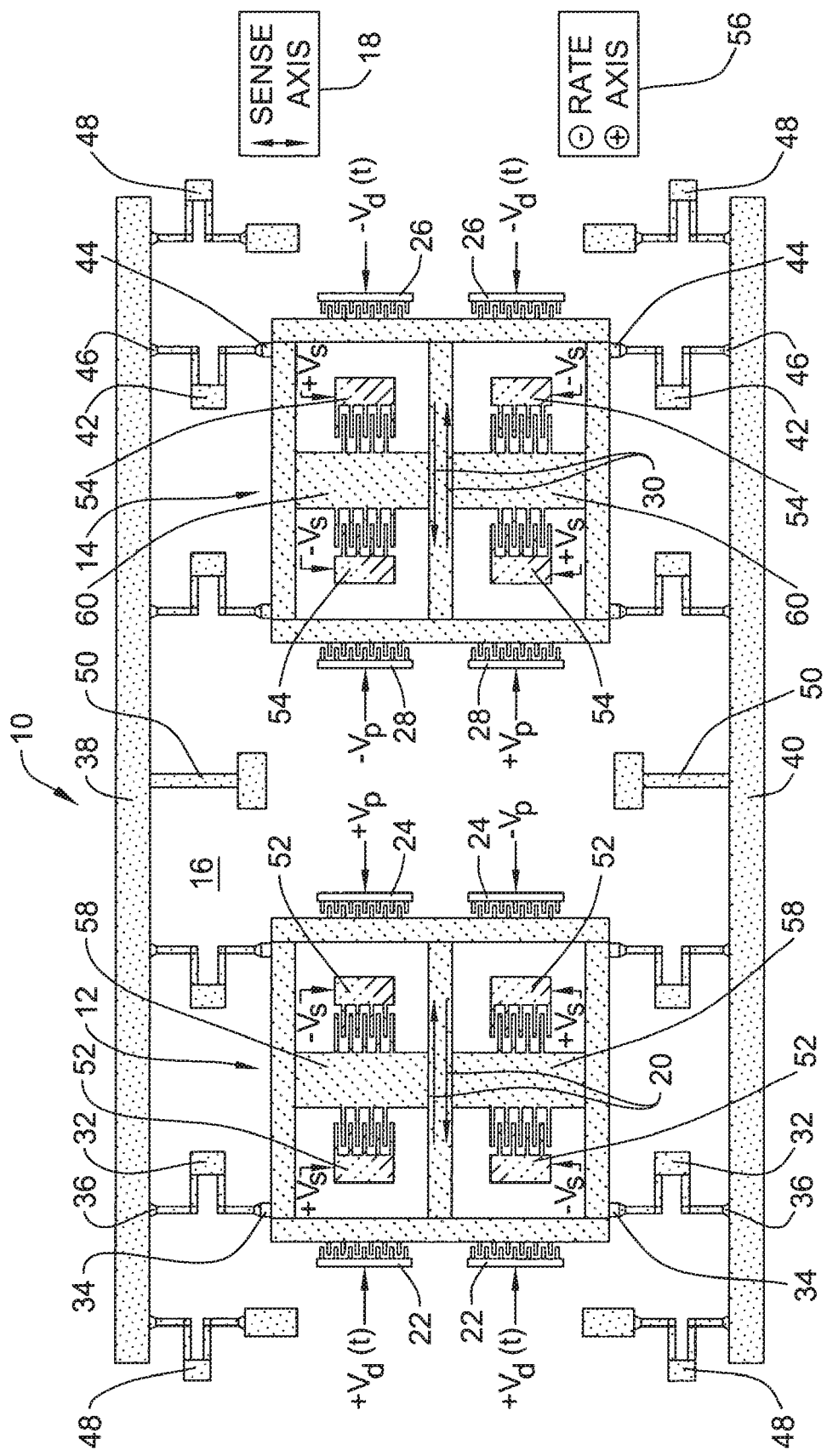
FIG. 1 illustrates a block diagram of one embodiment of a MEMS gyroscope made with sets of drive combs electrodes, sets of motor pickoff combs, and sets of sense combs having fingers separated by gaps having high aspect ratios without deterioration of sidewall planarity.

In the following detailed description, reference is made to the accompanying drawings that form a part hereof, and in which is shown by way of illustration specific illustrative embodiments. However, it is to be understood that other embodiments may be utilized and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

A method of making devices with a comb structure having fingers separated by gaps having higher aspect ratios without deterioration of sidewall planarity, in comparison to the Bosch process, is disclosed. The same technique can be used to make trenches in semiconductor devices such as integrated circuits and MEMS. By increasing the aspect ratio of the gaps without deterioration of sidewall planarity, the devices utilizing the comb structures, such as gyroscopes, can be operated at lower voltages and have increased sensing performance, e.g. a lower angle random walk (ARW) noise metric.

Embodiments of the invention can be used in making accelerometers, gyroscopes, and other types of sensors. One example of a gyroscope using an embodiment of the invention will be subsequently described. FIG. 1 illustrates a block diagram of one embodiment of a MEMS gyroscope 10 made with sets of drive combs electrodes, sets of motor pickoff combs, and sets of sense combs having fingers separated by gaps having high aspect ratios without deterioration of sidewall planarity. Optionally, the sets of drive combs electrodes, the sets of motor pickoff combs, and sets of sense combs made according to the embodiments subsequently described herein, e.g. with respect to FIGS. 2 and 3. The operation of the illustrated MEMS gyroscope is described in U.S. Pat. No. 7,036,373, which is hereby incorporated by reference in its entirety. A MEMS gyroscope however, can be implemented in other MEMS gyroscope architectures.

The MEMS gyroscope 10 illustrated in FIG. 1 is an illustrative a vibratory-type, rate, out-of-plane MEMS gyroscope employing a number of vertical comb drive elements. The MEMS gyroscope 10 includes a first proof mass 12 and a second proof mass 14, each adapted to oscillate back and forth above a lower substrate 16 along an axis perpendicular a sense axis 18 of the gyroscope 10. The first and second proof masses 12, 14 can be formed, e.g. from a silicon structure bonded to the lower substrate 16, which can include a number of recesses and/or mesas that permit selective portions of the silicon structure to move. The lower substrate 16 may be referred elsewhere herein as a substrate.

As indicated generally by the right/left set of arrows 20, the first proof mass 12 can be configured to oscillate back and forth between a first set of drive electrodes 22 and a first set of motor pickoff combs 24, both of which can be configured to remain stationary above the lower substrate 16. In similar fashion, the second proof mass 14 can be configured to oscillate back and forth above the lower substrate 16 between a second set of drive electrodes 26 and a second set of motor pickoff combs 28, but 180° out-of-phase with the first proof mass 12, as indicated generally by the left/right set of arrows 30.

The first and second proof masses 12, 14 can be mechanically coupled to the lower substrate 16 using one or more suspension springs that act to constrain motion of the first and second proof masses 12, 14 along a motor drive axis indicated by arrows 20 and 30. As shown in FIG. 1, for example, the first proof mass 12 can be anchored or otherwise coupled to the lower substrate 16 using a first set of four suspension springs 32 each connected at a first end 34 thereof to the first proof mass 12 and at a second end 36 thereof to a number of silicon cross-beams 38, 40. In similar fashion, the second proof mass 14 can be anchored or otherwise coupled to the lower substrate 16 using a second set of four suspension springs 42 each connected at a first end 44 thereof to the second proof mass 14 and at a second end 46 thereof to the first and second silicon cross-beams 38,40. The first and second silicon cross-beams 38, 40, in turn, can be coupled to the lower substrate 16 via a number of suspension springs 48 and support members 50, which can be used to further constrain oscillatory drive movement of the first and second proof masses 12, 14 along an axis perpendicular to the direction of the sense axis 18.

The drive system for gyroscope 10 can include a number of interdigitated drive comb fingers that can be used to electrostatically drive the proof masses 12, 14 in the direction indicated generally by arrows 20 and 30. In the illustrative gyroscope 10 depicted in FIG. 1, for example, the first set of comb drive electrodes 22 can each include a number of vertical comb fingers interdigitated with a number of vertical comb fingers coupled to the first proof mass 12. The second set of comb drive electrodes 26, in turn, can each include a number of vertical comb fingers interdigitated with a number of comb fingers coupled to the second proof mass 14. While each of the comb drive electrodes 22, 26 illustrative in FIG. 1 are shown having seven comb drive fingers apiece, it should be understood that a greater or lesser number of comb drive fingers can be employed, if desired.

A motor drive voltage $V_d(t)$ can be applied to the first and second set of drive electrodes 22, 26, inducing an electrostatic force within the gap between each adjacent interdigitated comb finger that causes the comb fingers to move with respect to each other. The motor drive voltage $V_d(t)$ can be configured to output a time-varying voltage signal to alternative the charge delivered to the comb drive electrodes 22, 26, which in conjunction with the suspension springs 32, 42, causes the first and second proof masses 12, 14 to oscillate back and forth above the lower substrate 16. Typically, the motor drive voltage $V_d(t)$ will produce an electrostatic force at the resonant frequency of the motor mode of the first and second proof masses 12, 14, although other desired frequencies can be employed, if desired. The motor mode resonant motion of the proof masses 12, 14 includes motion of the two proof masses 12, 14 in opposing directions along the motor drive axis indicated by arrows 20, 30 in FIG. 1.

To detect and measure displacement of the proof masses 12, 14, a number of motor pickoff combs 24, 28 can be further provided opposite each of the comb drive electrodes 22, 26. As with the comb drive electrodes 22,26, each of the motor pickoff combs 24, 28 can include a number of comb fingers interdigitated with a number of comb fingers coupled to the respective proof mass 12, 14. In use, a DC motor pickoff bias voltage $V_p$ can be applied to each of the motor pickoff combs 24, 28 to obtain a measure of proof mass displacement by measuring changes in electrostatic charge induced by relative displacement of the interdigitated comb fingers.

A first and second set of sense combs 52, 54 can be provided as a part of the sensing system to detect and measure displacement of the first and second proof masses 12, 14 in the direction of the sense axis 18 as a result of gyroscopic movement about an input or rate axis 56. As shown in FIG. 1, each set of sense combs 52, 54 can include a number of inwardly directed comb fingers interdigitated with a number of outwardly directed comb fingers coupled to a portion 58, 60 of each respective proof mass 12, 14. The sense combs 52, 54 can be configured so that small displacements of the proof masses 12, 14 along the sense axis 18 produce a change in capacitance between the interdigitated comb fingers. This capacitance change, combined with a sense bias voltage $V_s$ applied to each set of sense combs 52, 54, allows sensing of movement of the proof masses 12, 14 along the sense axis 18. In certain designs, the polarity of the sense bias voltage $V_s$ applied to each set of sense combs 52, 54 can be reversed or alternated between adjacent sets of sense combs 52, 54 to prevent the sense bias voltage $V_s$ from producing a current that could masquerade as a rate signal.

During operation, the angular rotation of the gyroscope 10 in conjunction with the motor motion of the proof masses 12, 14 produces a Coriolis force perpendicular to the rate axis 56 and motor drive axis 20,30, and parallel with the direction of the sense axis 18. These Coriolis forces produce motion of the proof masses 12, 14 along the sense axis 18, which can then be sensed by detecting and measuring charge signals or currents induced on sense combs 52, 54 resulting from movement of the interdigitated comb fingers along the sense axis 18. The resulting sense signal can then be fed to a charge amplifier and/or other sensing circuitry that can used to convert the charge signals or currents sensed into a rate signal indicative of the Coriolis force.

If the proof masses 12, 14 are misaligned with the comb drive fingers coupled to the comb drive electrodes 22, 26, a rate bias error or scale factor error may occur in which electric fields oriented primarily along the sense axis 18 of the gyroscope 10 produce forces on the proof masses 12, 14 along the sense axis 18. The rate bias error or scale factor error produced by these forces can be substantial in those cases where the motor drive voltages applied to the comb drive electrodes 22, 26 are significant (e.g. several volts or higher), and/or where the gap between each adjacent interdigitated comb finger is small (e.g. 2 to 3 um).

The comb drive electrodes can produce rate bias by either a static sense axis displacement of the comb drive fingers, or by a dynamic sense axis displacement of the drive comb fingers varying at the motor frequency. A typical out-of-plane MEMS gyroscope is designed so that only the differential sense axis displacement between the two proof masses contributes to rate bias. This differential displacement is referred to as sense mode displacement. The static component of sense mode displacement arises from static forces applied to the sense mode. These static forces can arise from package stress, thermal expansion mismatches, silicon suspension spring mismatches, or other effects unrelated to the motor drive voltage $V_d(t)$.

Optionally, the MEMS gyroscope 10 is configured to be configured to be coupled to one components in a vehicle in or on which the MEMS gyroscope is mounted or attached. The components may include a control system that may use rotation rate, determined from the MEMS gyroscope 10, to adjust the motion of the vehicle by adjusting control surfaces, e.g. rudder(s), aileron(s), and/or thrust vectoring system(s) such as gimbaled thrust systems.

Figure 2:
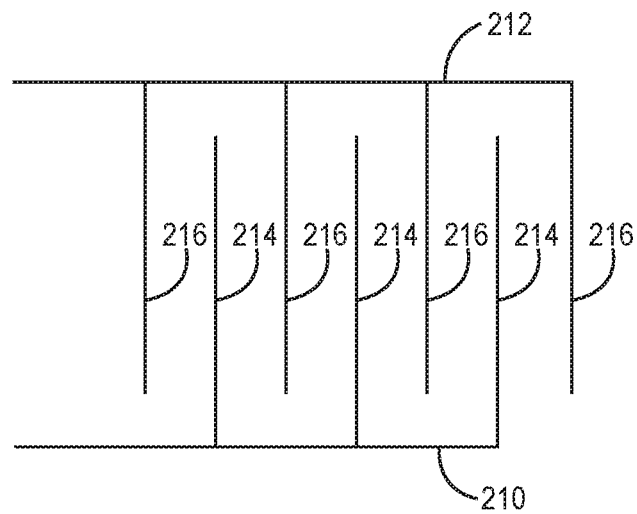
FIG. 2 illustrates an exemplary comb structure having fingers separated by gaps having high aspect ratios without deterioration of sidewall planarity.

The comb drive electrodes and sense combs described above are implemented with comb structures with high aspect ratios without deterioration of sidewall planarity formed as described below. An exemplary comb structure that can be used to implement such comb electrodes will now be described for pedagogical reasons. FIG. 2 illustrates an exemplary comb structure 200 having fingers separated by gaps having high aspect ratios without deterioration of sidewall planarity. The comb structure 200 includes a set of flexible conductive fingers 214 connected by a first support member 210 and a set of rigid conductive fingers 216 mechanically attached by a second support member 212. The set of flexible conductive fingers 214 and the set of rigid conductive fingers 216 are interdigitated. Each such set includes one or more fingers.

Like each rigid conductive finger 216, each flexible conductive finger 214 is substantially immoveable when not mechanically coupled to a moving object, e.g. a spring. However, because the set of flexible conductive fingers 214 is mechanically coupled by a spring to a fixture, e.g. a substrate, each flexible conductive finger 214 moves with movement of the spring. Such springs and fixture are illustrated elsewhere herein. Each rigid conductive finger 216 is substantially immoveable, and is mechanically coupled to the fixture but not through a spring.

The comb structure 200, including the conductive fingers of each set, is formed from at least one conductive material, such as a doped semiconductor (e.g. silicon), a metal (e.g. gold, platinum, tungsten, and/or ruthenium), and/or a metal alloy (titanium nitride). Optionally, the set of flexible conductive fingers 214 and the set of rigid conductive fingers 216 are electrically isolated from a component or substrate to which they are attached. An exemplary technique for mechanically attaching to, but electrically isolating, both sets from such component or substrate will be subsequently illustrated.

The separation between each pair of an flexible finger 214 and a rigid finger 216 (which have adjacent, substantially parallel sidewalls) may vary due to a force arising from acceleration, inertial force (e.g. Coriolis force), a magnetic field, light, and/or a change in temperature. As a result, the capacitance across each finger changes and the total capacitance of the comb structure 200 changes. For a given amount of charge, the square of the potential difference (or voltage) across a set of flexible conductive fingers 214 and a set of rigid conductive fingers 216 varies proportionally to the force pulling or pushing on the fingers of the sets. The electrostatic energy stored by the total capacitance of the comb structure equals one half of the total capacitance multiplied by the square of the potential difference across the set of flexible conductive fingers 214 and the set of rigid conductive fingers 216. If the aspect ratio (without deterioration of sidewall planarity) of the gap between each flexible conductive finger 214 and each rigid conductive finger 216 is increased, then the total capacitance of the comb structure 200 is increased. If the total capacitance of the comb structure 200 is increased, then the potential difference for a given amount of stored electrostatic energy is increased. As a result, the sensitivity of the comb structure 200 is increased.

The left most and rightmost rigid fingers 216 may be subsequently referred to as the "outer fingers" or "outer conductive fingers". In the illustrated embodiment both outer fingers are rigid fingers. However, the comb structure design can be implemented in different ways where the outer fingers are both flexible fingers, or a rigid finger and a flexible finger.

Figure 3:
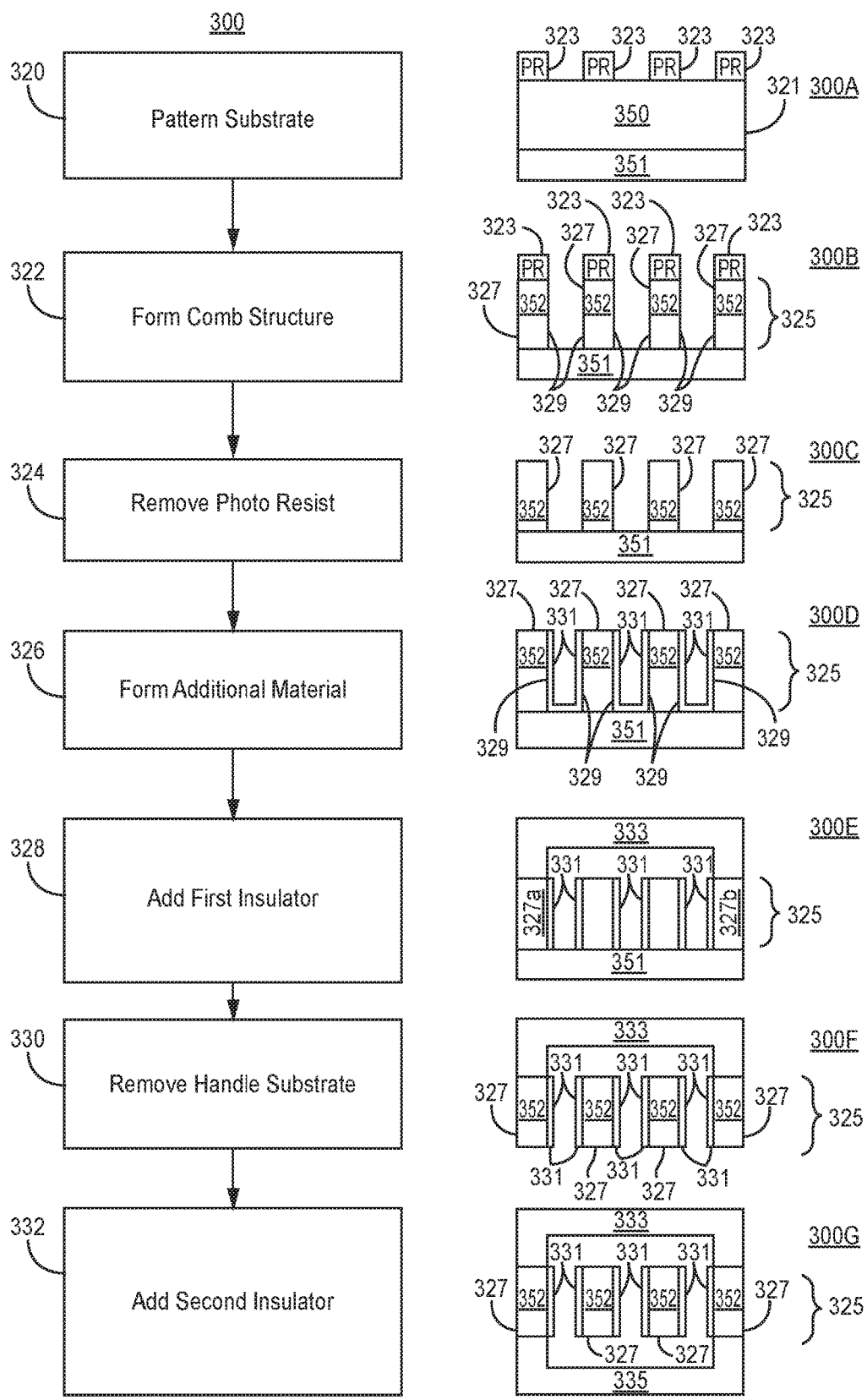
FIG. 3 illustrates the method for manufacturing a comb structure having fingers separated by gaps having high aspect ratios without deterioration of sidewall planarity and made with atomic layer deposition.

FIG. 3 illustrates the method for manufacturing a comb structure having fingers separated by gaps having high aspect ratios without deterioration of sidewall planarity and made with atomic layer deposition 300. To the extent the method 300 shown in FIG. 3 is described herein as being implemented in the system shown in FIG. 2, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 320, pattern a substrate 321 (e.g. all or a portion of which is a conductive region 350 for example doped semiconductor such as doped silicon) for example with photoresist (PR) 323 exposed by photo-, electro-beam, and/or X-ray lithography. The substrate 321, e.g. the conductive region 350, is affixed to a handle substrate 351, e.g. a handle wafer. An exemplary resulting structure is illustrated in cross-section 300A.

In block 322, form a comb structure 325, having conductive fingers 327, in the substrate 321. The comb structure 325 is formed by at least removing a portion of the conductive region of the substrate 321 between one or more pairs of flexible and rigid fingers where a sidewall 329 of the flexible finger is opposite a sidewall 329 of the rigid finger. An exemplary resulting structure is illustrated in cross-section 300B.

The comb structure 325 may be formed with the Bosch process as described above. Optionally, perform the etching, i.e. DRIE, of the Bosch process with $SF_6$ and optionally $O_2$, and perform the passivation of the Bosch process with $C_4F_8$. However, other chemicals can be used in lieu of the foregoing. Further, optionally, perform each of etching and passivation for 1-3 seconds. However, alternatively, other different periods of time can be used.

In block 324, remove the photoresist 323, e.g. with solvents or plasma, from the comb structure 325. An exemplary resulting structure is illustrated in cross-section 300C.

In block 326, using atomic layer deposition (ALD), form at least one atomic layer, one atomic layer at a time, of additional conductive material 331 on and/or over at least one sidewall 329 of each conductive finger 327, of the comb structure 325. Such sidewalls are adjacent and substantially parallel to sidewalls of other fingers as described elsewhere herein. Optionally, the fingers are made from a first conductor 352, e.g. a doped semiconductor, and the additional conductive material 331 is formed from at least one second conductor, e.g. one or more metals or metal alloys. The first conductor 352 may comprise more than one conductive material.

Atomic layer deposition uses a gaseous precursor, including an atom to be deposited, to form a single atomic layer of additional conductive material 331 at each deposition. Only an atomic single layer of additional conductive material 331 is formed because the gaseous precursor will only form on and/or over material forming the sidewall; the gaseous precursor will not form the additional conductive material 331 on and/or over itself. To form additional atomic layers, either a second precursor must be used alternatively with the original precursor to form atomic layers of different material (where the second precursor removes extraneous atoms, e.g. organic molecules, of the original precursor so that only a single atomic layer is formed), or the single layer of additional conductive material 331 must be otherwise chemically treated, e.g. with water steam, to remove the extraneous atoms (e.g. organic molecules) of the precursor to permit formation (with the precursor) of additional atomic layers of the additional material. Unlike deposition by non-atomic controlled chemical vapor deposition (CVD) (e.g. low pressure CVD and plasma enhanced CVD), sputtering or evaporation, atomic layer deposition results in:

(a) deposition of a layer of additional conductive material 331 that is conformal with the at least one sidewall 329 of each conductive finger 327 of the comb structure 325; and (b) deposition of the layer of additional conductive material 331 that has a uniform thickness along and over the at least one sidewall 329.

In one embodiment, the additional conductive material 331 may be one of the conductors specified elsewhere herein, such as titanium nitride (TiN). Optionally, form on and/or over at least one sidewall 329 of each conductive finger 327 of the comb structure 325 precursor tetrakis (dimethylamido)titanium (TDMAT) followed by an $H_2/N_2$ plasma.

Optionally, repeat block 326 as many times as need to form the appropriate conductor thickness on and/or over the sidewalls 329 of the fingers 327. Block 326 can be repeated to deposit two or more layers of the same conductor. An exemplary resulting structure is illustrated in cross-section 300D.

Alternatively, layers of different conductors can be applied, e.g. interleaved. For example, the MEMS gyroscope 100 can have measurement error arising from temperature variations due to the differences in temperature coefficients of expansion (TCEs) in materials used to form the fingers in the comb structure. Optionally, at least one layer of a conductor having a compressive force resulting from a temperature change may be interleaved between or formed on or over a corresponding layer of a conductor having a tensile force resulting from the temperature change. This can be used to cancel the difference in TCEs of the first conductor 352 and the additional conductive material 331.

The material deposited by atomic layer deposition may be selectively deposited on and/or over specific regions, e.g. on and/or over the sidewalls of the conductive fingers. This can be done, e.g., as follows. First, surface oxide is silylated to render nucleation site unreactive. Then, using a mask, the silylation agent is selectively removed using a combination of ultraviolet radiation and ozonolysis. The mask may be formed using the aforementioned lithography techniques. Subsequently, ALD is selectively performed where silylation moieties have been removed. The mask is subsequently removed. This technique is further described in the paper Guo et al., "Patterning of Solid Films via Selective Atomic Layer Deposition Based on Silylation and UV/Ozonolysis," ACS Appl. Mater. Interfaces 2016, 8, 30, 19836-19841, Jul. 25, 2016, which is incorporated herein by reference in its entirety.

Alternatively, the additional conductive material 331 may be deposited by ALD everywhere on and/or over device(s), e.g. on and/or over portion(s) of the substrate 321, conductive fingers 327 (including on substantially non-parallel surfaces) and/or the handle substrate 351. Then, some of the additional conductive material 331 is selectively removed, e.g. by masking and etching regions where the additional conductive material 331 is not desired, e.g. to avoid shorting the set of flexible conductive fingers 210 and the set of rigid conductive fingers. Such masking may be performed with resist and lithography (e.g. as described above), and etching such as chemical or dry etching.

In block 328, attach a first insulator 333 to both the comb structure 325 and the substrate (or die) from which the comb structure 325 is formed. The first insulator 333 supports comb structure 325 after the handle substrate 351 is removed. In the embodiment illustrated in FIG. 3, one portion of the first insulator is attached to all or a portion of a first outer finger 327a and a second outer finger 327b that are rigid fingers. The first insulator 333 is attached to surfaces of the first outer finger 327a and that second outer finger 327b that are perpendicular to surface(s) on those fingers where the additional material 331 was deposited, and substantially coplanar with a surface of a substrate (or a die) to which the first insulator 335 will also be attached. The comb structure 325 is formed from this substrate (or die).

FIG. 3 illustrates that the first insulator 333 is attached only to conductor on which the additional material 331 is formed. Optionally, the first insulator 333 may be attached to the additional material 331 and to the conductor on which the additional material 331 is formed.

Alternatively or additionally, the first insulator 333 may be attached to all or portion(s) of other rigid finger(s), e.g. that are not outer fingers, the first support member 210, and/or the second support member 212. For pedagogical reasons, the first insulator 333 will be illustrated as being attached to all or a portion of the first and the second outer fingers 327a, 327b. An exemplary resulting structure is illustrated in cross-section 300E.

The first insulator 333 is also attached to a portion of a surface of the substrate (or the die) from which the comb structure 325 is formed, e.g. as further described above. As a result, the first insulator 333 attaches (or anchors) the comb structure 325 to the substrate (or die) while allowing the flexible conductive fingers 214 to move.

In one embodiment, the first insulator 333 is borosilicate; however, alternatively, other insulators may be used. The borosilicate can be attached to the outer fingers 327a, 327b using anodic bonding, e.g. if the conductive fingers and substrate (or die) to which the borosilicate is attached is a semiconductor such as silicon. During anodic bonding, a voltage, e.g. 100-1000V is applied between the borosilicate and the substrate or die including the conductive fingers, while those borosilicate and substrate or die are heated, e.g. between 200 to 500 degrees C.

In block 330, remove the handle substrate 351 attaching adjacent conductive fingers. The handle substrate 351 may be removed by grinding, or wet or dry etching An exemplary resulting structure is illustrated in cross-section 300F.

Optionally, add a second insulator 335. In the embodiment illustrated in FIG. 3, one portion of the second insulator is attached to all or a portion of a first outer finger 327a and a second outer finger 327b that are rigid fingers. The second insulator 335 is attached to other surfaces of the first outer finger 327a and that second outer finger 327b that are perpendicular to surface(s) on those fingers where the additional material 331 was deposited, substantially coplanar with a surface of a substrate (or a die) to which the second insulator 335 will also be attached. The comb structure 325 is formed from this substrate (or die). The other surfaces are opposite the surfaces to which the first insulator 333 is attached. Thus, the first insulator 335 and the second insulator 335 are substantially parallel.

FIG. 3 illustrates that the second insulator 335 is attached only to conductor on which the additional material 331 is formed. Optionally, the second insulator 335 may be attached to the additional material 331 and to the conductor on which the additional material 331 is formed.

Alternatively or additionally, the second insulator 335 may be attached to all or portion(s) of other rigid finger(s), e.g. that are not outer fingers, the first support member 210, and/or the second support member 212. For pedagogical reasons, the second insulator 335 will be illustrated as being attached to all or a portion of the first and the second outer fingers 327a, 327b. An exemplary resulting structure is illustrated in cross-section 300G.

The second insulator 333 is also attached to a portion of another surface of the substrate (or the die) from which the comb structure 325 is formed, e.g. as further described above. Such surface is substantially parallel to the surface of the substrate (or the die) to which the first insulator is attached. As a result, the second insulator 333 also anchors the comb structure 325 to the substrate (or die) while allowing the flexible conductive fingers 214 to move. The second insulator 333 may be attached to the fingers and substrate using anodic bonding as described above. However, the first insulator and/or the second insulator 335 may be formed and attached in different ways.

While the present teachings have been illustrated with respect to one or more implementations, alterations and/or modifications can be made to the illustrated examples without departing from the scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Terms of relative position as used in this application are defined based on a plane parallel to, or in the case of the term coplanar—the same plane as, the conventional plane or working surface of a device, wafer, or substrate, regardless of orientation. The term "horizontal" or "lateral" as used in this application are defined as a plane parallel to the conventional plane or working surface of a device, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of device, wafer, or substrate, regardless of orientation. The term "coplanar" as used in this application is defined as a plane in the same plane as the conventional plane or working surface of a device, wafer, or substrate, regardless of orientation.

EXAMPLE EMBODIMENTS

Example 1 includes a method, comprising: patterning a substrate, including a conductive region, with photoresist exposed by lithography, where the substrate is mounted on a handle substrate; forming a comb structure with conductive fingers on the substrate by at least removing a portion of the conductive region of the substrate; removing the photoresist; conformally forming, one atomic layer at a time, at least one atomic layer of at least one conductor over at least one sidewall of each conductive finger; wherein the at least one atomic layer has a uniform thickness over the at least one sidewall; attaching at least one insulator layer to the comb structure, and the substrate from which the comb structure is formed; and removing the handle substrate.

Example 2 includes the method of Example of Example 1, where the conductive fingers comprise a doped semiconductor, and the conductor comprises a metal or a metal alloy.

Example 3 includes the method of any of Examples 1-2, wherein forming, the one atomic layer at a time, the at least one atomic layer of the at least one conductor over the sidewalls comprises forming, the one atomic layer at a time, at least two atomic layers of different conductors over the at least one sidewall of each conductive finger.

Example 4 includes the method of Example 3, wherein forming at least two atomic layers comprises forming at least two atomic layers comprising alternating layers of a first conductor and a second conductor.

Example 5 includes the method of Example 4, where the first conductor has a tensile stress and the second conductor has a compressive stress.

Example 6 includes the method of any of Examples 1-5, where the at least one atomic layer of conductor is selectively formed over the sidewalls.

Example 7 includes the method of any of Examples 1-6, where the at least one atomic layer of conductor is selectively removed.

Example 8 includes the method of any of Examples 1-7, wherein attaching the at least one insulator layer comprises attaching the at least one insulator layer using anodic bonding.

Example 9 includes a comb structure, comprising: a set of flexible conductive fingers comprising at least one conductor; a set of rigid conductive fingers comprising the at least one conductor; wherein the flexible conductive fingers and the rigid conductive fingers are interdigitated; wherein each of the flexible conductive fingers has at least one sidewall each of which is opposite of a sidewall of a rigid conductive finger; wherein at least one of: (a) the at least one sidewall of the flexible conductive fingers and (b) each of the corresponding opposite sidewalls of the rigid conductive fingers is conformally covered by at least one atomic layer, of at least one conductor, formed one atomic layer at a time; wherein the at least one atomic layer has a uniform thickness over the sidewalls that it covers; and at least one insulator layer attaching each set to a substrate.

Example 10 includes the comb structure of Example 9, wherein the at least one conductor, comprising the set of flexible conductive fingers and the set of rigid conductive fingers, comprises a semiconductor; and wherein the at least one conductor covering the at least one sidewall of the flexible conductive fingers and the corresponding sidewall of the rigid conductive fingers comprises at least one layer of at least one of: a metal and a metal alloy.

Example 11 includes the comb structure of Example 10, wherein the at least one layer comprises at a second layer of a metal or a metal alloy on a first layer of a metal or metal alloy.

Example 12 includes the comb structure of Example 11, where the one of the first and second layers has a tensile stress, and the other one of the first and second layers has a compressive stress.

Example 13 includes the comb structure of any of Examples 9-12, wherein the at least one conductor comprises at least one of titanium nitride, tungsten, gold, platinum, and ruthenium.

Example 14 includes the comb structure of any of Examples 9-13, wherein the at least one insulator comprises borosilicate.

Example 15 includes a micro-electro-mechanical systems (MEMS) gyroscope, comprising: a first proof mass; a second proof mass; a first cross-beam; a second cross-beam; a first set of suspension springs mechanically coupled between the proof mass and the first cross-beam and the second cross-beam; a second set of suspension springs mechanically coupled between the proof mass and the first cross-beam and the second cross-beam; a substrate; a third set of suspension springs mechanically coupled between the first cross-beam and the substrate; a fourth set of suspension springs mechanically coupled between the second cross-beam and the substrate; at least one first support member coupling the first cross-beam and the substrate; at least one second support member coupling the first cross-beam and the substrate; a first set of sense combs attached to the first proof mass and comprising flexible conductive fingers mechanically coupled to the first proof mass, and interdigitated with rigid conductive fingers fixedly coupled to a substrate; a second set of sense combs attached to the second proof mass and comprising flexible conductive fingers mechanically coupled to the second proof mass, and interdigitated with rigid conductive fingers fixedly coupled to a substrate; a first set of drive comb electrodes attached to the first proof mass and comprising flexible conductive fingers mechanically coupled to the first proof mass, and interdigitated with rigid conductive fingers fixedly coupled to a substrate; a second set of drive comb electrodes attached to the second proof mass and comprising flexible conductive fingers mechanically coupled to the second proof mass, and interdigitated with rigid conductive fingers fixedly coupled to a substrate; a first set of motor pick off combs attached to the first proof mass and comprising flexible conductive fingers mechanically coupled to the first proof mass, and interdigitated with rigid conductive fingers fixedly coupled to a substrate; a second set of motor pickoff combs attached to the second proof mass and comprising flexible conductive fingers mechanically coupled to the second proof mass, and interdigitated with rigid conductive fingers fixedly coupled to a substrate; wherein, in each set, each of the flexible conductive fingers has at least one sidewall each of which is opposite of a sidewall of a rigid conductive finger; wherein at least one of: (a) the at least one sidewall of the flexible conductive fingers and (b) each of the corresponding opposite sidewalls of the rigid conductive fingers is conformally covered by at least one atomic layer, of at least one conductor, formed one atomic layer at a time; wherein the at least one atomic layer has a uniform thickness over the sidewalls that it covers; and at least one insulator layer attaching each set to a substrate.

Example 16 includes the comb structure of Example 15, wherein the at least one conductor, comprising the set of flexible conductive fingers and the set of rigid conductive fingers, comprises a semiconductor; and wherein the at least one conductor covering the at least one sidewall of the flexible conductive fingers and the corresponding sidewall of the rigid conductive fingers comprises at least one layer of at least one of: a metal and a metal alloy.

Example 17 includes the comb structure of Example 16, wherein the at least one layer comprises at a second layer of a metal or a metal alloy on a first layer of a metal or metal alloy.

Example 18 includes the comb structure of Example 17, where the one of the first and second layers has a tensile stress, and the other one of the first and second layers has a compressive stress.

Example 19 includes the comb structure of any of Examples 15-18, wherein the at least one conductor comprises at least one of titanium nitride, tungsten, gold, platinum, and ruthenium.

Example 20 includes the comb structure of any of Examples 15-19, wherein the at least one insulator comprises borosilicate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method, comprising:
   patterning a substrate, including a conductive region, with photoresist exposed by lithography, where the substrate is mounted on a handle substrate;
   forming a first comb structure comprising conductive fingers on the substrate by at least removing a portion of the conductive region of the substrate;
   removing the photoresist;
   conformally forming, one atomic layer at a time, at least one atomic layer of at least one conductor over at least one sidewall of each conductive finger of the first comb structure for a micro-electro-mechanical system (MEMS);
   wherein the at least one atomic layer has a uniform thickness over the at least one sidewall;
   attaching at least one insulator layer to the first comb structure, and the substrate from which the first comb structure is formed; and
   forming, by removing the handle substrate, a second comb structure from the first comb structure, for the MEMS, and comprising a set of flexible conductive fingers comprising at least one conductor, and a set of rigid conductive fingers comprising the at least one conductor, wherein flexible conductive fingers are interdigitated with rigid conductive fingers.

2. The method of claim 1, where the conductive fingers comprise a doped semiconductor, and the at least one conductor comprises a metal or a metal alloy.

3. The method of claim 1, wherein forming, the one atomic layer at a time, the at least one atomic layer of the at least one conductor over the at least one sidewall comprises forming, the one atomic layer at a time, at least two atomic layers of different conductors over the at least one sidewall of each conductive finger.

4. The method of claim 3, wherein forming at least two atomic layers comprises forming at least two atomic layers comprising alternating layers of a first conductor and a second conductor.

5. The method of claim 4, wherein the first conductor has a tensile stress or a compressive stress, and the second conductor has respectively the compressive stress or the tensile stress.

6. The method of claim 1, wherein the at least one atomic layer of conductor is selectively formed over the at least one sidewall.

7. The method of claim 1, wherein the at least one atomic layer of conductor is selectively removed.

8. The method of claim 1, wherein attaching the at least one insulator layer comprises attaching the at least one insulator layer using anodic bonding.

9. The method of claim 1, wherein the at least one conductor comprises at least one of titanium nitride, tungsten, gold, platinum, and ruthenium.

10. The method of claim 1, wherein the at least one insulator layer comprises borosilicate.

\* \* \* \* \*